United States Patent
Liu et al.

(10) Patent No.: US 9,024,640 B2
(45) Date of Patent: May 5, 2015

(54) ACTIVE DIAGNOSTICS AND GROUND FAULT DETECTION ON PHOTOVOLTAIC STRINGS

(75) Inventors: Yu Liu, Milwaukee, WI (US); Charles John Luebke, Hartland, WI (US); Christopher Scott Thompson, Kingston, RI (US)

(73) Assignee: Eaton Corporation, Cleveland, OH (US)

( * ) Notice: Subject to any disclaimer, the term of this patent is extended or adjusted under 35 U.S.C. 154(b) by 305 days.

(21) Appl. No.: 13/607,932

(22) Filed: Sep. 10, 2012

(65) Prior Publication Data

US 2014/0070815 A1     Mar. 13, 2014

(51) Int. Cl.
*G01R 31/14* (2006.01)
*G01R 31/02* (2006.01)
*G01R 21/133* (2006.01)

(52) U.S. Cl.
CPC ............ *G01R 31/025* (2013.01); *G01R 21/133* (2013.01)

(58) Field of Classification Search
CPC .... G01R 31/025; G01R 31/405; G01R 31/42; G01R 31/2605; G01R 31/02; G01R 31/14; G01R 31/40; G01R 31/2803; G01R 21/133; H01L 31/02021; H01L 31/042; H02J 3/383; G05F 1/67
USPC ......... 324/126, 500, 508–511, 541, 544, 551, 324/96, 111, 348, 522, 523, 527, 537, 555, 324/713; 702/64, 184, 57, 60, 63; 307/82; 136/243–252
See application file for complete search history.

(56) References Cited

U.S. PATENT DOCUMENTS 7,812,592 B2 * 10/2010 Prior et al. ................. 324/76.39
8,471,574 B2 *  6/2013 Beck ............................. 324/713
(Continued)

FOREIGN PATENT DOCUMENTS

EP         2648009 A1    10/2013
JP       2010199443 A     9/2010
(Continued)

OTHER PUBLICATIONS

Bo et al., "A New Architecture for High Efficiency Maximum Power Point Tracking in Grid-Connected Photovoltaic System," IEEE, 2009, pp. 2117-2121.

(Continued)

*Primary Examiner* — Huy Q Phan
*Assistant Examiner* — Raul Rios Russo
(74) *Attorney, Agent, or Firm* — Ziolkowski Patent Solutions Group, SC

(57) ABSTRACT

A PV system includes a plurality of PV strings configured to generate a string output power responsive to received solar irradiation, with a source conductor and a return conductor being provided from the PV strings. One or more DC voltage regulators are electrically connected to the PV strings on at least one of the source or return conductors, with the DC voltage regulator being configured to regulate the voltage of a respective PV string or group of strings. A controller selectively controls a voltage output by the DC voltage regulator and is programmed to periodically cause the DC voltage regulator to alter the voltage of a PV string or group of strings, detect a change in current in the respective PV string(s) responsive to the altering of the voltage, and perform at least one of a PV string degradation detection and causal diagnosis and a grounded conductor fault detection.

21 Claims, 5 Drawing Sheets

(56) References Cited

U.S. PATENT DOCUMENTS

| | | | |
|---|---|---|---|
| 2008/0122449 | A1 | 5/2008 | Besser et al. |
| 2008/0150366 | A1 | 6/2008 | Adest et al. |
| 2009/0150005 | A1 | 6/2009 | Hadar et al. |
| 2009/0248232 | A1 | 10/2009 | Sennett et al. |
| 2009/0284998 | A1 | 11/2009 | Zhang et al. |
| 2010/0001587 | A1 | 1/2010 | Casey et al. |
| 2010/0126550 | A1* | 5/2010 | Foss ............... 136/244 |
| 2010/0142227 | A1 | 6/2010 | Min et al. |
| 2010/0229915 | A1 | 9/2010 | Ledenev et al. |
| 2010/0301670 | A1* | 12/2010 | Wilhelm ............ 307/23 |
| 2011/0062784 | A1 | 3/2011 | Wolfs |
| 2012/0043988 | A1* | 2/2012 | Ramsey et al. ...... 324/761.01 |
| 2012/0053867 | A1 | 3/2012 | Dunn et al. |
| 2012/0187766 | A1 | 7/2012 | Cleland et al. |
| 2012/0280571 | A1* | 11/2012 | Hargis ............ 307/77 |
| 2013/0069438 | A1* | 3/2013 | Liu et al. ............ 307/82 |

FOREIGN PATENT DOCUMENTS

| | | |
|---|---|---|
| JP | 2012023875 A | 2/2012 |
| WO | 2010133730 A2 | 11/2010 |
| WO | 2012073836 A1 | 6/2012 |

OTHER PUBLICATIONS

Duran et al., "An Application of Interleaved DC-DC Converters to obtain I-V Characteristic Curves of Photovoltaic Modules," Industrial Electronics, 34th Annual Conference of IEEE, Piscataway, NJ, Nov. 10, 2008, pp. 2284-2289.

Duran et al., "A New Application of the Buck-Boost-Derived Converters to Obtain the I-V Curve of Photovoltaic Modules," Power Electronics Specialists Conference, Piscataway, NJ, Jun. 17, 2007, pp. 413-417.

PCT International Search Report and Written Opinion from corresponding PCT/US2013/057772, Dec. 18, 2013.

* cited by examiner

ACTIVE DIAGNOSTICS AND GROUND FAULT DETECTION ON PHOTOVOLTAIC STRINGS

BACKGROUND OF THE INVENTION

Embodiments of the present invention relate generally to photovoltaic (PV) power systems and, more particularly, to a PV power system that implements active diagnostics and provides for ground fault detection in grounded conductors of individual PV strings.

PV power systems are power systems that employ a plurality of solar modules to convert sunlight into electricity. PV systems include multiple components, including photovoltaic modules, mechanical and electrical connections and mountings, and means of regulating or modifying the electrical output. One common arrangement in PV systems is for several PV modules to be connected in series to form a PV string, with multiple PV strings in a PV system then being combined in parallel to aggregate the current in a PV array. The PV modules generate direct current (DC) power, with the level of DC current being dependent on solar irradiation and the level of DC voltage dependent on temperature. When alternating current (AC) power is desired, an inverter is used to convert the DC energy from the array into AC energy, such as AC energy suitable for transfer to a power grid.

PV power systems also include a balance-of-system comprising DC switching and protection devices, combiner boxes, circuit breakers, disconnect switches, and contactors. Combiner boxes aggregate the DC power from the PV strings and provide a parallel connection point (i.e., a common bus) for the PV strings, with the combiner box providing overcurrent protection and isolation means (i.e., disconnect). Combiner boxes are either source combiners or array combiners, with source combiners being located closer to the PV strings and array combiners—or re-combiners—aggregating outputs from several source combiners into a single circuit.

It is recognized that there are several system design and component challenges associated with the operation of PV power systems, including system monitoring and ground fault detection and protection. With respect to system monitoring, such monitoring in existing PV power systems is based on current measurements performed by current sensors in the PV systems. The current sensors might be located inside the combiner box, with each string having a current sensor or two or more strings sharing a current sensor, the current sensors might be located inside the recombiner box, with each input of the recombiner box having a current sensor, or the current sensors might be located inside the PV inverter. The current measurements from current sensors are sampled periodically (e.g., sampling rate of 15 minutes) and this current data is then to central service for analyzing by an algorithm. The algorithm identifies degraded strings or degraded groups of strings (depending on current sensor locations) by data-mining current measurement with values lower than the average/typical current.

The limitation of the state-of-art PV system monitoring is that it can only identify degraded string or degraded group of strings, but it cannot diagnose the problem/reasons that causes the degradation. This is because at any moment in time with a central inverter, there is a single Maximum Power Point (MPP) voltage for the array.

With respect to ground fault detection and protection, such ground fault detection and protection in existing PV power systems is typically ground fault detection, shutdown, and alarming at the inverter for ground faults within the PV array. However, the state-of-the-art ground fault detection only can detect ground faults in ungrounded conductors, it cannot detect ground faults in grounded conductors.

It would therefore be desirable to provide a PV power system and method of monitoring thereof that provides for active diagnostics in the PV system and diagnosis of the reasons that causes degradation of PV strings (or groups of PV strings) in the PV system. It would further be desired to for such a PV system and method of monitoring thereof to provide the capability to detect ground faults in a grounded current-carrying conductor.

BRIEF DESCRIPTION OF THE INVENTION

Embodiments of the present invention provide a system and method for controlling operation of a PV power system in order to detect and diagnose the cause of PV string degradation detection in the PV power system. The system and method for controlling operation of the PV power system also provide for grounded conductor fault detection.

In accordance with one aspect of the invention, a PV system includes a PV array comprising a plurality of PV strings configured to generate a string output power responsive to received solar irradiation, with a source conductor and a return conductor being provided from the PV strings. The PV system also includes a combiner box having a DC link therein connected to the plurality of PV strings such that the PV strings are connected thereto in a parallel arrangement, a PV inverter electrically connected to the combiner box to receive a DC output therefrom and to control the DC link voltage, and a DC voltage regulator electrically connected to each respective PV string or a group of PV strings on at least one of the source or return conductors, wherein the DC voltage regulator is configured to regulate the voltage of a respective PV string or group of PV strings. The PV system further includes a controller to selectively control a voltage output by the DC voltage regulator, with the controller being programmed to periodically cause the DC voltage regulator to alter the voltage of a respective PV string or group of PV strings, detect a change in current in the respective PV string or group of PV strings responsive to the altering of the voltage, and perform at least one of a PV string degradation detection and causal diagnosis and a grounded conductor fault detection.

In accordance with another aspect of the invention, a method for performing active diagnostics on a PV system includes operating each of a plurality of parallel arranged PV strings in a PV array at a DC bus voltage, with the DC bus voltage being determined by a PV inverter that is coupled to the plurality of PV strings by way of a DC bus. The method also includes selectively activating a DC voltage regulator electrically connected to a respective PV string or to a group of PV strings to regulate and selectively alter the voltage of a respective PV string or group of PV strings and detecting a change in current in a respective PV string or group of PV strings responsive to the altering of the voltage. The method further includes determining a current-voltage relationship for a respective PV string or group of PV strings based on the altered voltage and the detected current and performing at least one of a PV string degradation detection and causal diagnosis or a grounded conductor fault detection for a respective PV string or group of PV strings based on the current-voltage relationship.

In accordance with yet another aspect of the invention, a PV system includes a PV inverter and a DC link electrically coupled to the PV inverter and operating at a DC link voltage, wherein the DC link voltage is a variable voltage that is determined by the PV inverter according to a global maximum power point tracking (MPPT) algorithm. The PV system also includes a plurality of PV strings connected to the DC link in a parallel arrangement and being configured to generate a string output power responsive to received solar irradiation and one or more DC-DC converters connected to the plurality of PV strings, with each DC-DC converter being connected to at least one PV string so as to regulate voltage on the at least one PV string. Each DC-DC converter includes a controller programmed to selectively cause the one or more DC-DC converters to alter the voltage of the at least one respective PV string and perform an active diagnostic analysis of the plurality of PV strings in order to identify at least one of a cause of a PV string degradation and a grounded conductor fault detection.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION OF THE PREFERRED EMBODIMENTS

Embodiments of the invention set forth herein relate to a system and method for active diagnostics and ground fault detection in a PV power system. A PV system is provided that includes a plurality of wide-range or narrow range DC-DC converters that enable active diagnostics of PV strings in the PV system and diagnosis of the reasons that cause degradation of PV therein. The PV system also includes a DC-DC converter positioned in series with a grounded conductor to enable the detection of ground faults on the grounded conductor.

Figure 1:
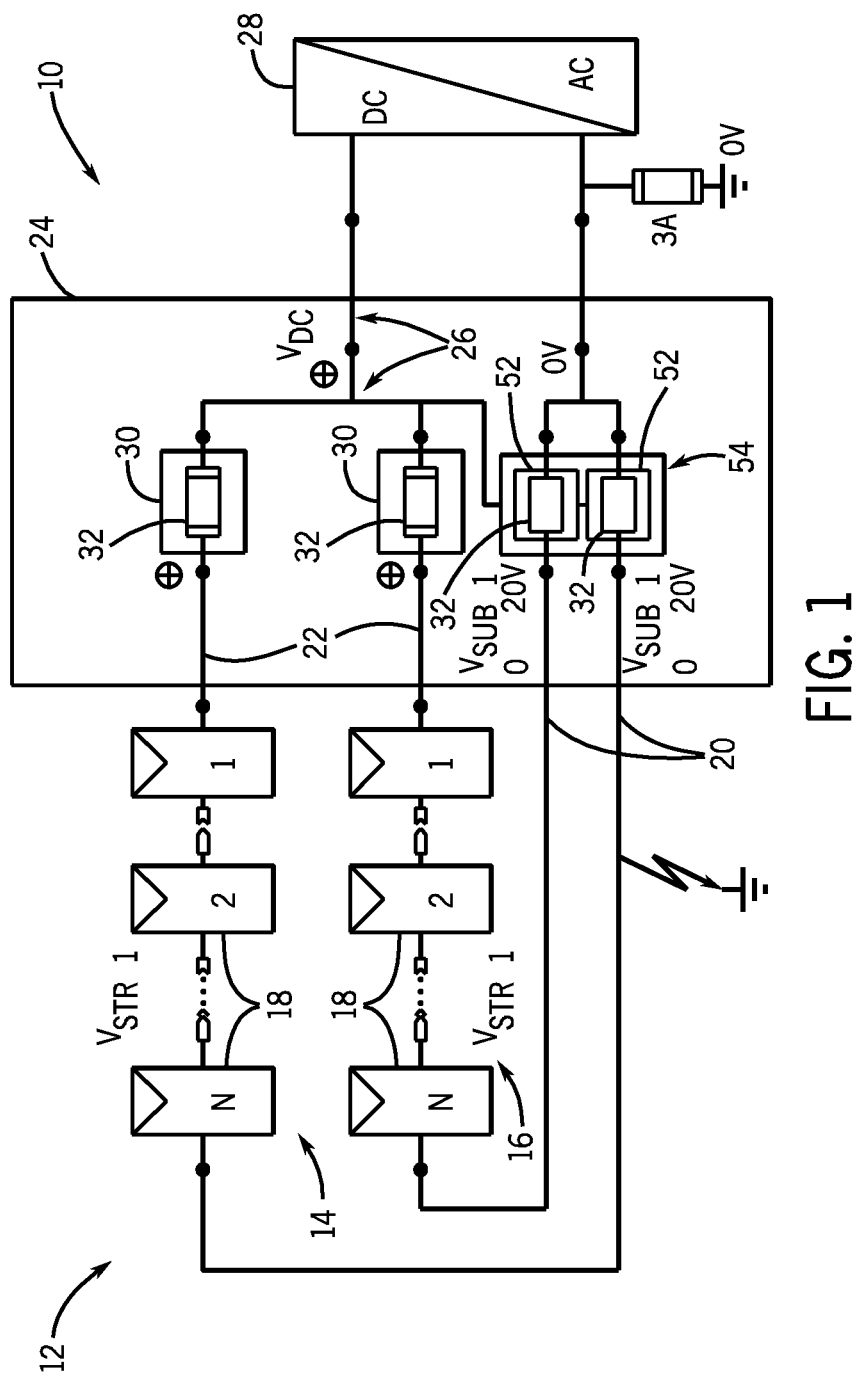
FIG. 1 is a schematic diagram of a PV system according to an embodiment of the invention.

Referring now to FIG. 1, a PV system 10 is illustrated according to an embodiment of the invention. The PV system 10 includes one or more PV arrays 12 each having a plurality of PV strings 14, 16, with each PV string in turn being comprised of a plurality of PV modules 18 that are connected in series. The PV modules 18 function to generate direct current (DC) power, with the level of DC current being dependent on solar irradiation and the level of DC voltage dependent on temperature. While only a first PV array 12 is shown in FIG. 1, it is recognized that the number of PV arrays 12 in PV power system 10 can vary, with two, three, four or more PV arrays 12 being included in the PV power system 10, for example. Similarly, while only two PV strings 14, 16 are shown as being included in PV array 12, it is recognized that the number of PV strings in PV array 12 can vary, with two, three, four or more PV strings being included in the PV array 12. A return conductor 20 and a source conductor 22 are provided from PV array 12, with return conductor 20 connecting the PV strings 14, 16 to a common return and source conductor 22 outputting the DC power generated from the plurality of PV strings 14, 16. According to the embodiment shown in FIG. 1, return conductor 20 is a grounded conductor and source conductor 22 is an ungrounded conductor, such that the PV system 10 is constructed as a negative-grounded PV system; however, it is recognized that additional embodiments of the invention may have PV system 10 constructed as a positive-grounded PV system, an ungrounded system, or a bi-polar PV system.

As shown in FIG. 1, the PV strings 14, 16 of PV array 12 are electrically connected in parallel to a combiner box 24 that houses a DC link or bus 26 therein. The combiner box 24 aggregates the DC power from the PV strings 14, 16 and provides a parallel connection point (i.e., a common DC bus 26) for the PV strings 14, 16, with the combiner box 24 providing overcurrent protection and isolation means (such as a disconnect switch 27).

Also included in PV system 10 is a PV inverter 28 that is electrically connected to the output of combiner box 24. The PV inverter 28 operates to perform the conversion of the variable DC output of the PV modules 18 of PV strings 14, 16 into a fixed frequency AC current (i.e., a DC-to-AC conversion) for use by an AC load, such as a power grid (not shown) for example. According to one embodiment of the invention, the PV inverter 28 is configured to perform a system level (or "global") maximum power point tracking (MPPT) in PV system 10 according to an array power algorithm implemented thereby. In performing such a global MPPT, PV inverter 28 functions to get the maximum possible power from the PV system 10 by dynamic loading of the PV array 12 to obtain maximum power for any given environmental conditions. The PV inverter 28 functions to control the voltage on the DC link 26 according to the MPPT instituted by the array power algorithm, based on the desired or required power to be output from the PV power system 10, and essentially defines the current that the inverter 28 should draw from the PV strings 14, 16 in order to get the maximum possible power (since power equals voltage times current) for the PV system 10.

As further shown in FIG. 1, PV system 10 includes a plurality of DC-DC converters 30 (or voltage regulators) for selectively varying and regulating voltages in PV system 10. According to one embodiment of the invention, and as shown in FIG. 1, a separate DC-DC converter 30 is electrically connected or coupled to each PV string 14, 16 in the PV system 10 and is located in combiner box 24. Each DC-DC converter 30 is connected with a respective PV string 14, 16 in series and, according to one embodiment, is configured as a narrow-range voltage regulator (e.g., partial-power rating series-connection DC-DC converter) that can regulate the voltage of a PV string within a narrow range. While the DC-DC converters 30 are shown in FIG. 1 as being positioned at the positive terminal (on the source conductor 22) of the PV strings 14, 16, it is recognized that, according to another embodiment of the invention, the DC-DC converters 30 could instead be positioned at the negative terminal (on the return conductor 20) of the PV strings 14, 16. Thus, both topologies are envisioned to fall within the scope of the invention.

Each DC-DC converter 30 includes a controller 32 operationally connected thereto to control functioning of the DC-DC converter 30, so as to selectively apply a voltage (e.g., a voltage pulse or applied voltage of longer duration) to the respective PV string 14, 16, thereby regulating the voltage of a respective PV string 14, 16. According to an exemplary embodiment of the invention, the controller 32 is programmed to control operation of DC-DC converter 30 in order to perform the MPPT function as well as active diagnostics and monitoring for each PV string 14, 16 in PV array 12. More specifically, the controller 32 is programmed to cause DC-DC converter 30 to dynamically alter the operating voltage on its respective PV string 14, 16 in order to detect degradation of a PV string and diagnose/determine the cause for such degradation. The controller 32 of each DC-DC converter 30 thus includes an "active diagnostics algorithm" programmed thereon to adjust and control generation of an output voltage from its respective DC-DC converter 30.

In operation, each DC-DC converter 30 regulates and alters the voltage on its respective PV string 14, 16 according to the active diagnostics algorithm implemented by its respective controller 32, such that the PV string 14, 16 is caused to operate at each of a plurality of distinct "test voltage" values. The DC-DC converter 30 can apply voltages of varying magnitude to the PV string 14, 16, with such voltages being in the form of a voltage having a positive value or a negative value, in order to alter the voltage on the PV string to a desired test voltage value. The voltage output from DC-DC converter 30 is regulated within a pre-determined voltage window, with the range of the window being based on whether DC-DC converter 30 is configured as a "wide-range voltage regulator" or a "narrow-range voltage regulator." In practice, the level of voltage (i.e., magnitude of the applied voltage) generated by each DC-DC converter 30 is quite small as compared to the overall PV system 10 voltages. For example, the output voltage of the DC-DC converters 30 may typically be 40V or less, such that the total power rating of the DC-DC converters 30 is only about 5% of the whole PV system 10 power rating. Thus, according to the embodiment of FIG. 1, small DC-DC converters 30 can be included in PV system 10 for connection to each PV string 14, 16 in series.

In regulating the voltage of PV strings 14, 16 to each of a plurality of test voltages by way of DC-DC converters 30, the currents of the PV strings 14, 16 will also be changed/varied responsive to the change in voltage. The controller 32 is configured to detect such changes in current and, with several samples of pairs of voltage and current, the controller 32 is able to determine a relationship between the current and voltage for its respective PV string 14, 16. Based on the nature of the current-voltage relationship determined by the controller 32, the controller is able to perform a PV string degradation detection and causal diagnosis for such degradation. That is, the nature of the current-voltage relationship on the PV string 14, 16 is indicative of a particular type of PV string degradation and problem.

Figure 2:
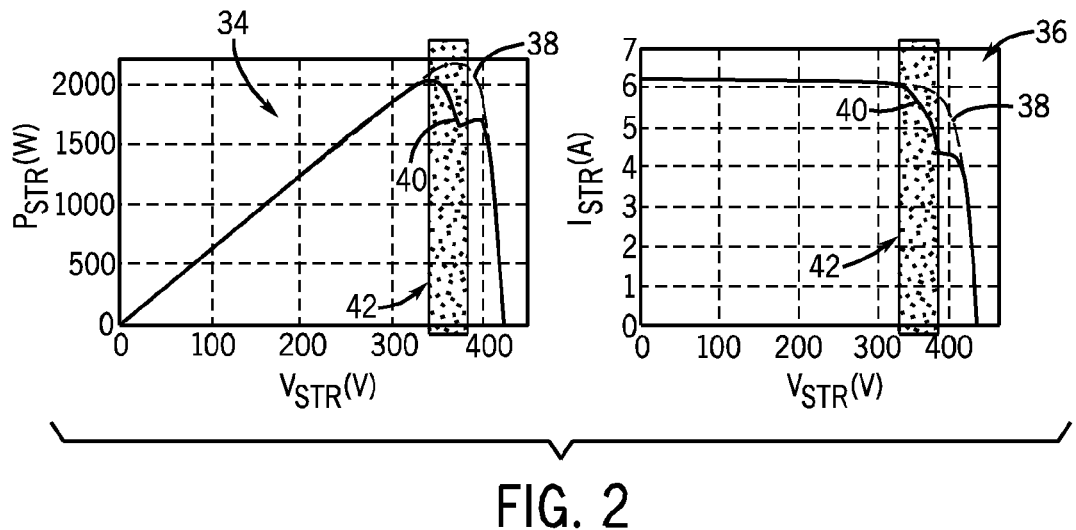
FIG. 2 is a pair of graphs illustrating a power versus voltage and current versus voltage curves for a healthy PV string and a degraded PV string.

As shown in FIG. 2, the nature of the current-voltage relationship on the PV string can be illustrated in graphical form, with power-voltage curves 34 and current-voltage curves 36 being shown for a healthy PV string (indicated as 38) and a degraded PV string (indicated as 40). As is known, the shape of a power vs. voltage curve and/or current vs. voltage curve is dependent on characteristics of a particular PV string, such as shading issues, uneven temperature distribution, and/or other specific characteristics of individual PV strings, and thus can vary between PV strings (and between modules on each string). Thus, in diagnosing/identifying the particular cause or reason for the degradation of a PV string, the current-voltage relationship (and/or power voltage relationship) is analyzed within a voltage window 42.

Figure 3A:
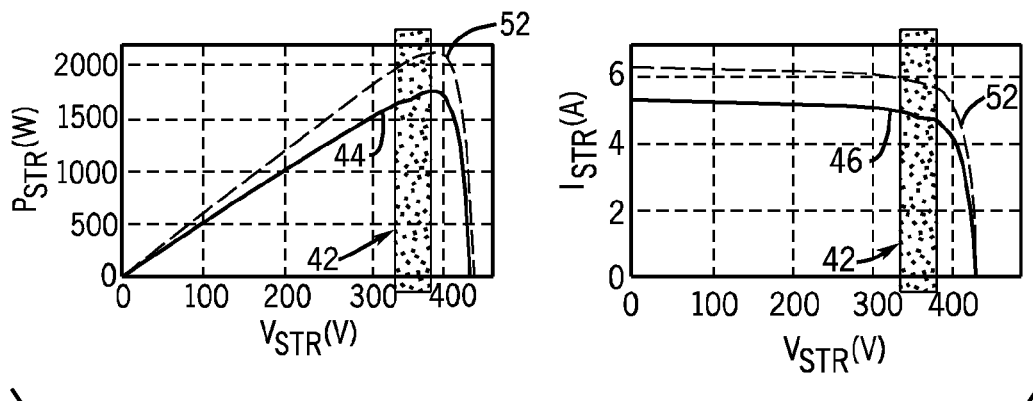
FIG. 3A is a pair of graphs illustrating a power versus voltage and current versus voltage curves for a healthy PV string and a PV string with a soiling problem.
Figure 3B:
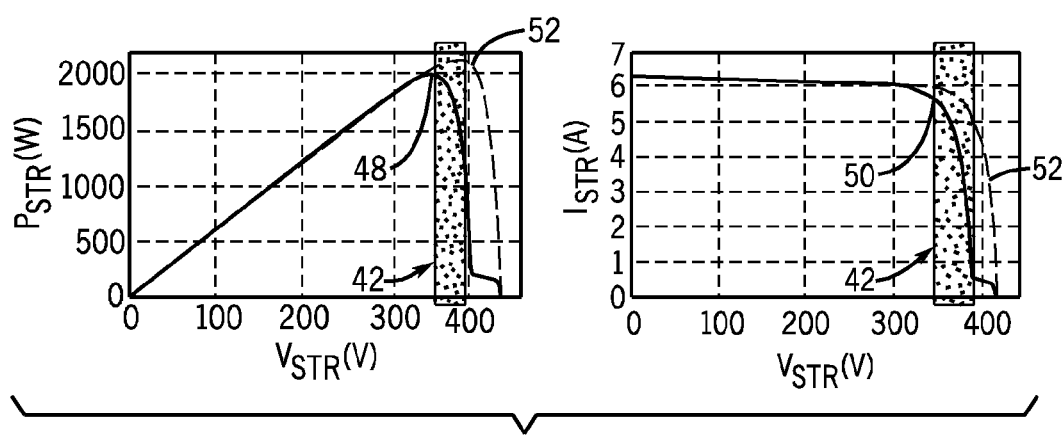
FIG. 3B is a pair of graphs illustrating a power versus voltage and current versus voltage curves for a healthy PV string and a PV string with module(s) having damaged cells.

In the particular examples shown in FIGS. 3A and 3B, a power-voltage curve 44 and current-voltage curve 46 for a PV string with degradation caused by a soiling problem (FIG. 3A) and a power-voltage curve 48 and current-voltage curve 50 for a PV string with degradation caused by several damages cells in a PV module (FIG. 3B) are provided, in comparison to such curves for healthy PV strings (indicated as 50).

The performing of the active diagnostics by controller 32 for purposes of detecting PV string degradation and determining a cause for such degradation is performed periodically during operation of the PV system 10. For example, such active diagnostics may be performed every 15 minutes, every hour, or according to another desired schedule. At the designated times, the controller 32 controls DC-DC converter 30 to generate output voltages so as to cause the respective PV string 14, 16 to operate at a plurality of distinct test voltages, with corresponding current values being measured responsive thereto for purposes of detecting and identifying degradation of the PV string, as explained in detail above.

Referring again to FIG. 1, in addition to providing DC-DC converters 30 for PV strings at the positive terminal, on the source conductor 22 (i.e., ungrounded conductor in PV system 10), DC-DC converters 52 (i.e., voltage regulators) are also positioned at the negative terminal, on the return conductor 20 (i.e., grounded conductor in PV system 10). One or more DC-DC converters 52, such as a DC-DC converter corresponding to each PV string 14, 16) are positioned on the grounded conductor 20 to form a ground fault detection unit 54 that is series connected to the grounded conductor 20, with the ground fault detection unit 54 being integrated into combiner box 24 according to one embodiment of the invention. According to embodiments of the invention, the DC-DC converters 52 of ground fault detection unit 54 may be configured as "wide-range voltage regulators" or a "narrow-range voltage regulators" that allow for voltage regulation of the grounded conductor within a voltage window of pre-determined size.

In operation, a controller 32 associated with each DC-DC converter 52 causes the DC-DC converter 52 to increase the voltage level of the grounded current-carrying conductor 20. The controller 32 then detects any change in the current on the grounded conductor 20 in order to determine if a fault-to-ground is present on the grounded conductor 20. If the grounded conductor 20 is in a "normal" condition (i.e., no ground fault present), no change in current will be detected in response to an increased voltage of the grounded current-carrying conductor. However, if a fault-to-ground is present on the grounded conductor 20, an increased voltage of the grounded current-carrying conductor will cause a large increase in the current on the grounded conductor 20 that is detected by the controller 32. The increase in the current value is detected on the grounded conductor at two ground points, as is seen in FIG. 1.

Figure 4A:
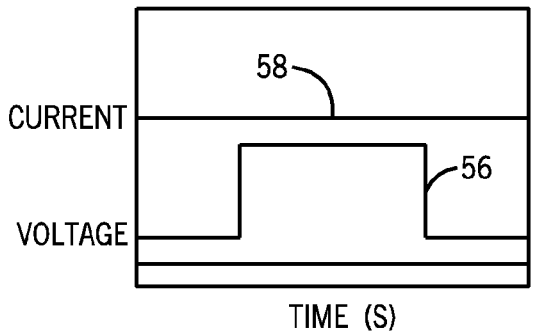
FIG. 4A is a graph illustrating voltage and power characteristics of a grounded conductor free of a ground fault condition.
Figure 4B:
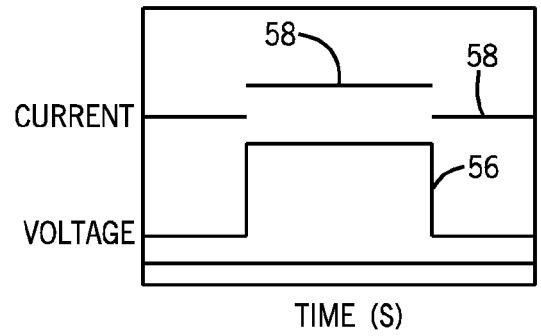
FIG. 4B is a graph illustrating voltage and power characteristics of a grounded conductor in a ground fault condition.

As shown in FIGS. 4A and 4B, and with reference still to FIG. 1, the voltage 56 of grounded conductor 20 is caused to increase by detection unit 54 and the current 58 is measured/detected responsive to the increased voltage. As seen in FIG. 4A, when no ground fault is present on grounded conductor 20, the current 58 remains constant. As seen in FIG. 4B, when a ground fault is present on grounded conductor 20, the current 58 increases responsive to the increased voltage 56. As an example, if the current increase is 1 A, then a ground fault with approximately 20 ohm impedance is detected and if the current increase is about 0.1 A, then a ground fault with approximately 200 ohm impedance is detected.

In practice, the DC-DC converters 52 of ground fault detection unit 54 can generate a 20V pulse, for example, to apply to grounded conductor 20, with such a voltage pulse being ideally applied early in the morning (i.e., before PV system is powered via solar radiation) in order to test for the presence of a ground fault. Thus, if a ground fault is detected, corrections can be made to the PV system 10 prior to the hours of peak power generation, so as to minimize the downtime of the PV system 10 during desired operating hours.

Figure 5:
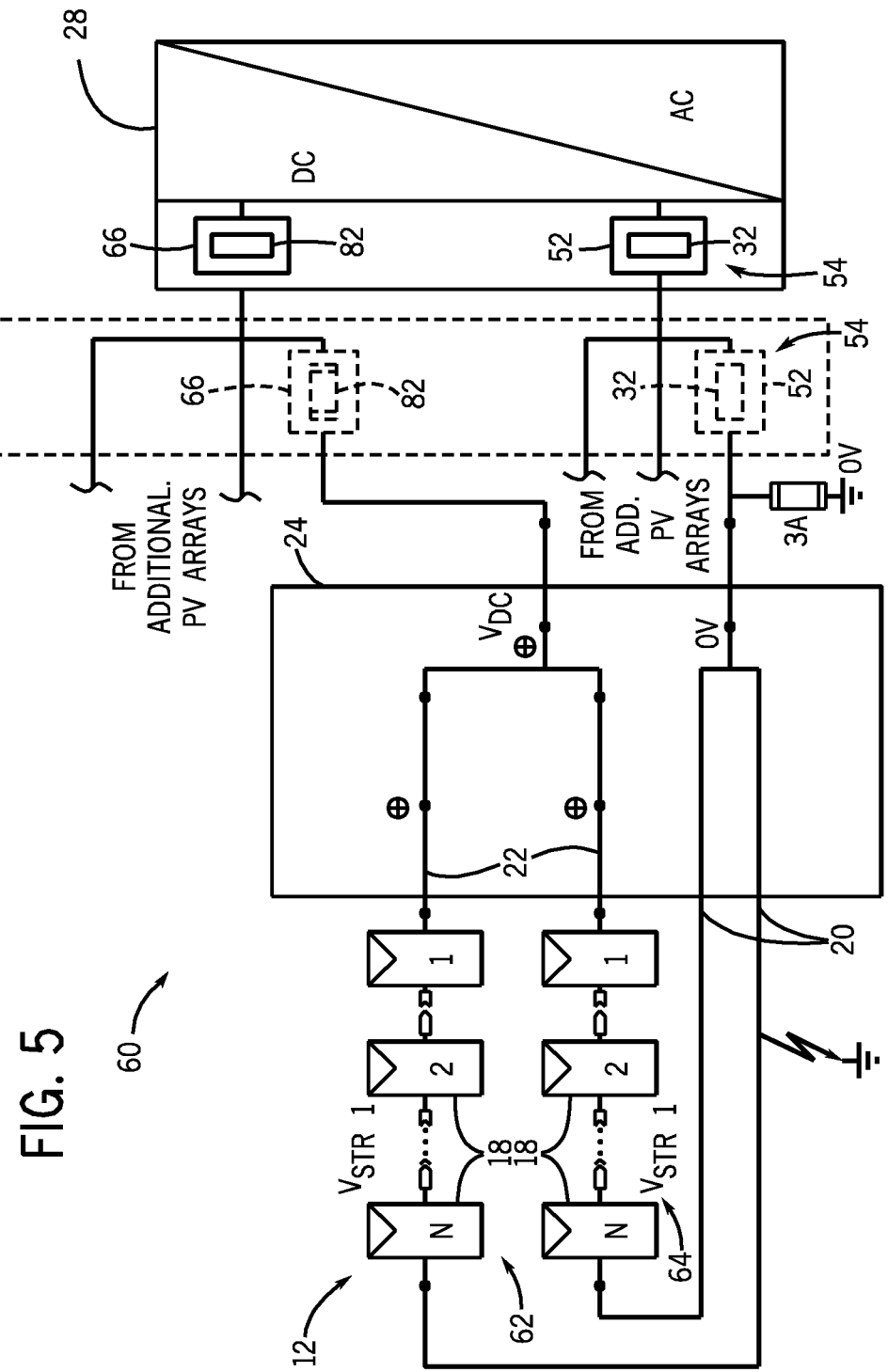
FIG. 5 is a schematic diagram of a PV system according to another embodiment of the invention.

Referring now to FIG. 5, a PV system 60 is illustrated according to another embodiment of the invention. The PV system 60 operates similarly to the PV system 10 shown in FIG. 1; however, the topology of PV system 60 differs slightly from that of PV system 10. Specifically, PV system 60 is configured such that a plurality of PV strings 62, 64 are provided that are arranged in parallel, with the plurality of PV strings being connected to a single DC-DC converter 66 included in the PV system. While two PV strings 62, 64, are shown in FIG. 5, it is recognized that a greater number of PV strings could be included in PV system 60. As shown in FIG. 5, the DC-DC converter 66 is positioned in PV inverter 28; however, it is recognized that, according to another embodiment, the DC-DC converter 66 may be positioned in a re-combiner box 68 that receives the output of multiple combiner boxes 24 (i.e., output of multiple PV arrays), as shown in phantom in FIG. 5.

The DC-DC converter 66 is configured to operate similar to the DC-DC converters 30 shown and described in FIG. 1. That is, the DC-DC converter 66 includes a controller 82 that controls functioning of the DC-DC converter 66, so as to selectively vary a voltage output of the DC-DC converter 66 that regulates the voltage of the PV strings 62, 64. According to one embodiment, the DC-DC converter 66 is configured as a wide-range voltage regulator (e.g., full-power rating series-connection dc-dc converter) that can regulate the voltage of a PV string within a wide range. In operation, the controller 32 is programmed to cause DC-DC converter 66 to dynamically alter the operating voltage on the PV strings 62, 64 in order to detect degradation of a PV string and diagnose/determine the cause for such degradation. The controller 32 implements an active diagnostics algorithm to adjust and control generation of an output voltage from the DC-DC converter 66, such that the PV strings 66 are caused to operate at each of a plurality of distinct "test voltage" values. The controller 32 is configured to detect changes in current on the PV strings 62, 64 that correspond to the test voltages and, with several samples of pairs of voltage and current, the controller 32 is able to determine a relationship between the current and voltage for the PV strings 62, 64. The controller 32 is then able to perform a PV string degradation detection and causal diagnosis for such degradation, with the nature of the current-voltage relationship on the PV strings 62, 64 being indicative of a particular type of PV string degradation and problem.

As further shown in FIG. 5, a ground fault detection unit 54 is positioned in series on the return/grounded conductor 20. According to the embodiment of PV system 60 shown in FIG. 5, the ground fault detection unit 54 is positioned on the combined grounded conductor 20, with the ground fault detection unit 54 being positioned in PV inverter 28 or in a re-combiner box 68 (as shown in phantom). The ground fault detection unit includes DC-DC converter 52 having a controller 32 associated therewith. As described above with respect to FIG. 1, controller 32 causes the DC-DC converter 52 to increase the voltage level of the grounded current-carrying conductor 20. The controller 32 then detects any change in the current on the grounded conductor 20 in order to determine if a fault-to-ground is present on the grounded conductor 20. If the grounded conductor 20 is in a "normal" condition (i.e., no ground fault present), no change in current will be detected in response to an increased voltage of the grounded current-carrying conductor. However, if a fault-to-ground is present on the grounded conductor 20, an increased voltage of the grounded current-carrying conductor will cause a large increase in the current on the grounded conductor 20 that is detected by the controller 32.

Figure 6:
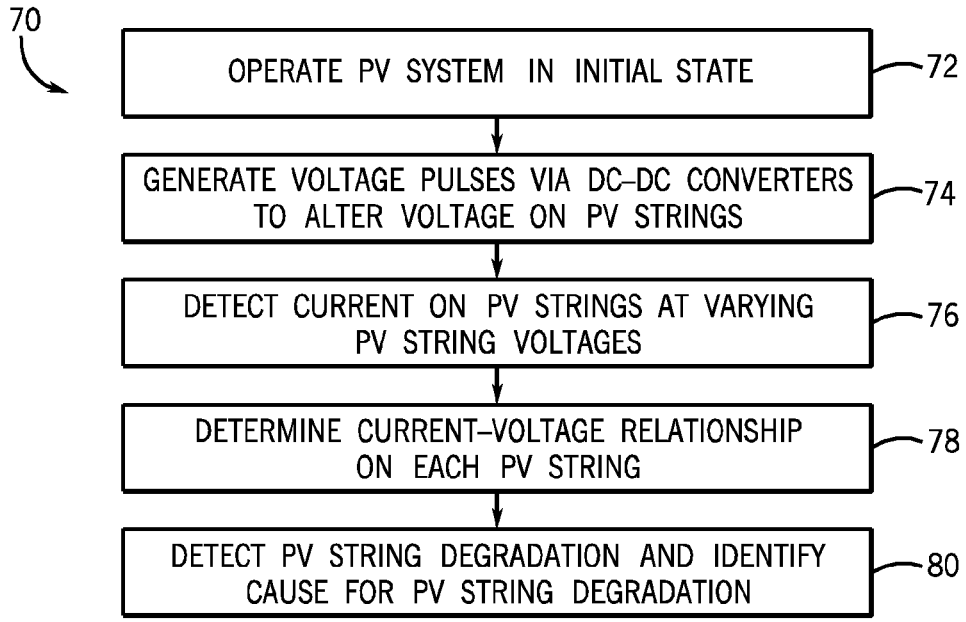
FIG. 6 is a flowchart illustrating a technique for detecting and identifying the cause of a PV string degradation in the PV system of FIGS. 1 and 5 according to an embodiment of the invention.

Referring now to FIG. 6, and with continued reference to FIGS. 1 and 5, a flowchart illustrating a technique 70 for detecting a PV string degradation and identifying a cause of such degradation is provided. According to one embodiment, the technique 70 is implemented by controllers 32 by execution of an active diagnostics algorithm. The technique 70 begins at STEP 72, where the PV system 10 is in/at an "initial state" with the voltage being output by DC-DC converters 30 being at zero. At pre-determined time intervals, such as every fifteen or sixty minutes for example, the controller 32 associated with each delta DC-DC converter 30 causes its respective DC-DC converter 30 to selectively apply voltages (e.g., voltage pulses) of desired value/magnitude so as to alter the voltage of a respective PV string or group of PV strings to a number of different values within a pre-determined voltage window, as indicated at STEP 74. At STEP 76, the current level of the PV string is measured responsive to the altering of the voltage (i.e., at each of a number of distinct PV string voltages), with a number of voltage and current pairs thus being acquired. A relationship between the current and voltage for a respective PV string or group of PV strings is then determined at STEP 78 from the number of acquired voltage and current pairs, with the nature of the current-voltage relationship being indicative of a particular type of PV string degradation on a respective PV string. Thus, at STEP 80, a PV string degradation detection and causal diagnosis is performed by the controller based on the nature of the current-voltage relationship. For example, the controller may determine that the PV string degradation has been caused by a soiling problem, by several damages cells in a PV module, or by some other identifiable factor.

Figure 7:
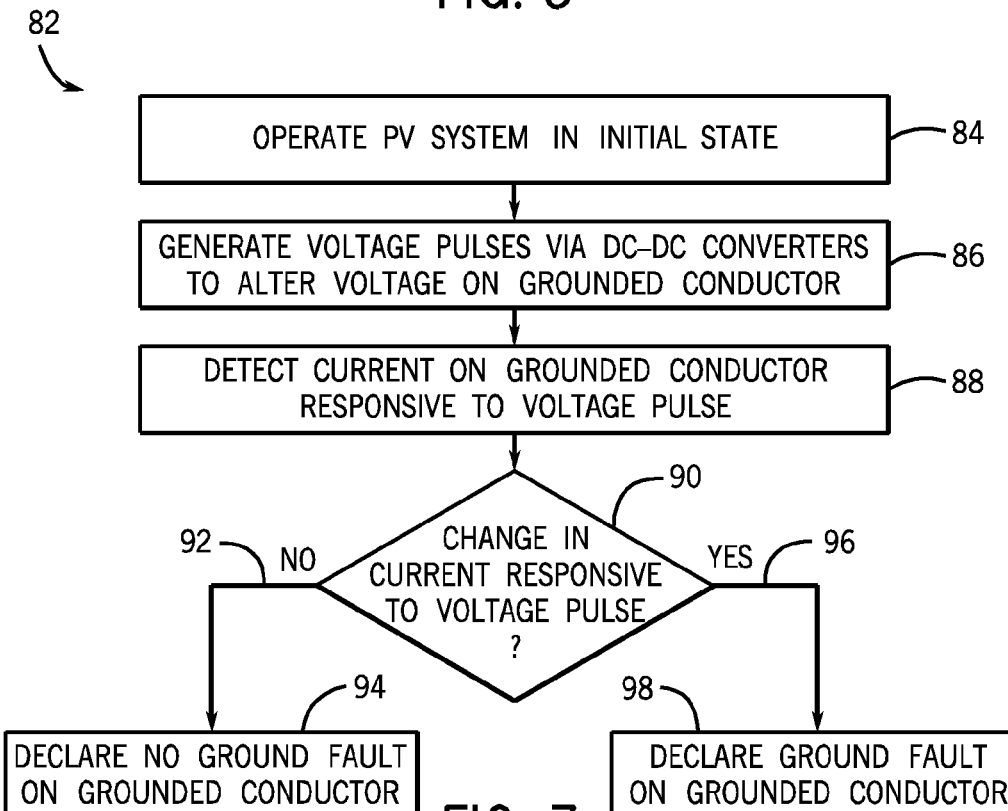
FIG. 7 is a flowchart illustrating a technique for detecting a detecting a fault-to-ground on a grounded conductor in the PV system of FIGS. 1 and 5 according to an embodiment of the invention.

Referring now to FIG. 7, and with continued reference to FIGS. 1 and 5, a flowchart illustrating a technique 82 for detecting a fault-to-ground on a grounded conductor in the PV system is provided. Again, according to one embodiment, the technique 82 is implemented by controllers 32 by execution of a ground fault detection algorithm. The technique 82 begins at STEP 84, where the PV system 10 is in/at an "initial state" with the voltage being output by DC-DC converters 52 in ground fault detection unit 54 being at zero. At a pre-determined time, such as early in the morning before PV system is powered by solar radiation, the controller 32 associated with each delta DC-DC converter 52 in ground fault detection unit 54 causes its respective DC-DC converter 52 to selectively apply voltages of desired value/magnitude to alter the voltage on the ground conductor 20, as indicated at STEP 86. At STEP 88, the current level of the grounded conductor 20 is measured, to see if any change in current was caused by the applied voltage. At STEP 90, a determination is made to determine if any change in current was caused. If it is determined at STEP 90 that no change in current was caused by the applied voltage, indicated at 92, then the technique 82 continues at STEP 94, where it is declared that no ground fault is present on the grounded conductor. Conversely, if it is determined at STEP 90 that a change in current was caused by the applied voltage (i.e., the current increased), indicated at 96, responsive to the altering of the voltage, then the technique 82 continues at STEP 98, where it is declared that a ground fault is present on the grounded conductor.

Beneficially, embodiments of the invention thus provide a system and method for implementing active diagnostics in a PV power system in order to provide for detection of degradation of PV strings, for identification of the cause and source of such PV string degradation, and for ground fault detection in grounded conductors of PV strings.

A technical contribution for the disclosed method and apparatus is that it provides for a controller implemented technique for controlling operation of a PV power system in order to enable detection and diagnosis of the cause of PV string degradation in a PV power system. The technique further enables detection of fault-to-ground on a grounded current carrying conductor.

Therefore, according to one embodiment of the present invention, a PV system includes a PV array comprising a plurality of PV strings configured to generate a string output power responsive to received solar irradiation, with a source conductor and a return conductor being provided from the PV strings. The PV system also includes a combiner box having a DC link therein connected to the plurality of PV strings such that the PV strings are connected thereto in a parallel arrangement, a PV inverter electrically connected to the combiner box to receive a DC output therefrom and to control the DC link voltage, and a DC voltage regulator electrically connected to each respective PV string or a group of PV strings on at least one of the source or return conductors, wherein the DC voltage regulator is configured to regulate the voltage of a respective PV string or group of PV strings. The PV system further includes a controller to selectively control a voltage output by the DC voltage regulator, with the controller being programmed to periodically cause the DC voltage regulator to alter the voltage of a respective PV string or group of PV strings, detect a change in current in the respective PV string or group of PV strings responsive to the altering of the voltage, and perform at least one of a PV string degradation detection and causal diagnosis and a grounded conductor fault detection.

According to another embodiment of present invention, a method for performing active diagnostics on a PV system includes operating each of a plurality of parallel arranged PV strings in a PV array at a DC bus voltage, with the DC bus voltage being determined by a PV inverter that is coupled to the plurality of PV strings by way of a DC bus. The method also includes selectively activating a DC voltage regulator electrically connected to a respective PV string or to a group of PV strings to regulate and selectively alter the voltage of a respective PV string or group of PV strings and detecting a change in current in a respective PV string or group of PV strings responsive to the altering of the voltage. The method further includes determining a current-voltage relationship for a respective PV string or group of PV strings based on the altered voltage and the detected current and performing at least one of a PV string degradation detection and causal diagnosis or a grounded conductor fault detection for a respective PV string or group of PV strings based on the current-voltage relationship.

According to yet another embodiment of the present invention, a PV system includes a PV inverter and a DC link electrically coupled to the PV inverter and operating at a DC link voltage, wherein the DC link voltage is a variable voltage that is determined by the PV inverter according to a global maximum power point tracking (MPPT) algorithm. The PV system also includes a plurality of PV strings connected to the DC link in a parallel arrangement and being configured to generate a string output power responsive to received solar irradiation and one or more DC-DC converters connected to the plurality of PV strings, with each DC-DC converter being connected to at least one PV string so as to regulate voltage on the at least one PV string. Each DC-DC converter includes a controller programmed to selectively cause the one or more DC-DC converters to alter the voltage of the at least one respective PV string and perform an active diagnostic analysis of the plurality of PV strings in order to identify at least one of a cause of a PV string degradation and a grounded conductor fault detection.

The present invention has been described in terms of the preferred embodiment, and it is recognized that equivalents, alternatives, and modifications, aside from those expressly stated, are possible and within the scope of the appending claims.

What is claimed is:

1. A photovoltaic (PV) system comprising:
   a PV array comprising a plurality of PV strings configured to generate a string output power responsive to received solar irradiation, with a source conductor and a return conductor being provided from the PV strings;
   a combiner box having a DC link therein connected to the plurality of PV strings, wherein the plurality of PV strings are connected to the DC link in a parallel arrangement;
   a PV inverter electrically connected to the combiner box to receive a DC output therefrom, the PV inverter configured to control the DC link voltage;
   a DC voltage regulator electrically connected to each respective PV string or a group of PV strings on at least one of the source or return conductors and electrically connected to the DC link, wherein the DC voltage regulator is configured to regulate the voltage of a respective PV string or group of PV strings; and
   a controller to selectively control a voltage output by the DC voltage regulator, the controller being programmed to:
      periodically cause the DC voltage regulator to alter the voltage of a respective PV string or group of PV strings;
      detect a change in current in the respective PV string or group of PV strings responsive to the altering of the voltage; and
      perform at least one of a PV string degradation detection and causal diagnosis and a grounded conductor fault detection.

2. The PV system of claim 1 wherein a DC voltage regulator is series connected to each respective PV string to regulate the voltage thereon, with each DC voltage regulator being located on a respective PV string or in the combiner box.

3. The PV system of claim 1 wherein the DC voltage regulator is electrically connected to a group of PV strings to collectively regulate the voltage thereon, with the DC voltage regulator being located in either the PV inverter or a recombiner box.

4. The PV system of claim 1 wherein the DC voltage regulator is configured to regulate the voltage of a PV string or group of PV strings within a voltage window.

5. The PV system of claim 4 wherein the DC voltage regulator comprises one of a full-power rating DC voltage regulator configured to regulate the voltage of a PV string or group of PV strings within a voltage window having a first range or a partial-power rating DC voltage regulator configured to regulate the voltage of a PV string or group of PV strings within a voltage window of a second range that is smaller than the first range.

6. The PV system of claim 4 wherein the controller is configured to:
cause the DC voltage regulator to alter the voltage of a respective PV string or group of PV strings such that the respective PV string or group of PV strings operates at a plurality of voltage values within the voltage window;
detect a current value in the respective PV string or group of PV strings at each of the plurality of voltage values; and
determine a current-voltage relationship on the PV string from the plurality of voltage values and corresponding current values.

7. The PV system of claim 6 wherein the controller is configured to determine a cause of a PV string degradation for a respective PV string based on the determined current-voltage relationship for the PV string.

8. The PV system of claim 6 wherein, in determining the current-voltage relationship for a respective PV string, the controller is configured to plot a current versus voltage curve or a power versus voltage curve.

9. The PV system of claim 1 wherein a DC voltage regulator is series connected to the grounded conductor, and wherein the controller is configured to:
cause the DC voltage regulator to increase the voltage value on the grounded conductor; and
determine the presence and magnitude of a fault-to-ground current on the grounded conductor responsive to the increased voltage value on the grounded conductor.

10. The PV system of claim 1 wherein the controller is configured to implement an active diagnostics algorithm in order to enable the PV string degradation detection and causal diagnosis and implement a ground fault detection algorithm to enable the grounded conductor fault detection.

11. A method for performing active diagnostics on a photovoltaic (PV) system, the method comprising:
operating each of a plurality of parallel arranged PV strings in a PV array at a DC bus voltage, with the DC bus voltage being determined by a PV inverter that is coupled to the plurality of PV strings by way of a DC bus;
activating a DC voltage regulator electrically connected to a respective PV string or to a group of PV strings and electrically connected to the DC bus to:
regulate the voltage of the respective PV string or group of PV strings so as to operate at the DC bus voltage; and
selectively alter the voltage of the respective PV string or group of PV strings to perform diagnostics and monitoring of each PV string;
detecting a change in current in a respective PV string or group of PV strings responsive to the altering of the voltage;
determining a current-voltage relationship for a respective PV string or group of PV strings based on the altered voltage and the detected current; and
performing at least one of a PV string degradation detection and causal diagnosis or a grounded conductor fault detection for a respective PV string or group of PV strings based on the current-voltage relationship.

12. The method of claim 11 wherein selectively activating the DC voltage regulator comprises causing the DC voltage regulator to alter the voltage of a respective PV string or group of PV strings such that the respective PV string or group of PV strings operates at a plurality of voltage values within a defined voltage window.

13. The method of claim 12 wherein determining a current-voltage relationship comprises comparing a detected current value corresponding to each of the plurality of voltage values in order to determine the current-voltage relationship for a respective PV string or group of PV strings.

14. The method of claim 13 wherein a cause of a degradation of a PV string or group of PV strings is based on the determined current-voltage relationship for the respective PV string or group of PV strings.

15. The method of claim 11 wherein a DC voltage regulator is electrically connected to a grounded conductor of the plurality of PV strings.

16. The method of claim 15 wherein selectively activating the DC voltage regulator comprises:
causing the DC voltage regulator to increase the voltage value on the grounded conductor; and
determining the presence and magnitude of a fault-to-ground current on the grounded conductor based on the increased voltage value on the grounded conductor.

17. A photovoltaic (PV) system comprising:
a PV inverter;
a DC link electrically coupled to the PV inverter and operating at a DC link voltage, wherein the DC link voltage is a variable voltage that is determined by the PV inverter according to a global maximum power point tracking (MPPT) algorithm;
a plurality of PV strings connected to the DC link in a parallel arrangement and being configured to generate a string output power responsive to received solar irradiation; and
one or more DC-DC converters connected to the plurality of PV strings and located between the plurality of PV strings and the DC link, with each DC-DC converter being connected to at least one PV string so as to regulate voltage on the at least one PV string to operate at the DC link voltage;
wherein each DC-DC converter comprises a controller programmed to:
selectively cause the one or more DC-DC converters to alter the voltage of the at least one respective PV string; and
perform an active diagnostic analysis of the plurality of PV strings in order to identify at least one of a cause of a PV string degradation and a grounded conductor fault detection.

18. The PV system of claim 17 wherein the controller is configured to:
cause the DC-DC converter to alter the voltage of the at least one respective PV string so as to operate at a plurality of distinct test voltages;
detect a current value in the at least one respective PV string at each of the plurality of test voltages;
determine a current-voltage relationship on the at least one respective PV string from the plurality of test voltages and corresponding current values; and
identify the cause of a respective PV string degradation based on the current-voltage relationship.

19. The PV system of claim 18 wherein the DC-DC converter is configured to alter the voltage of the at least one PV string within a voltage window.

20. The PV system of claim 19 wherein the DC-DC converter comprises one of a full-power rating DC-DC converter configured to regulate the voltage of at least one PV string within a voltage window having a first range or a partial-power rating DC-DC converter configured to regulate the voltage of at least one PV string within a voltage window of a second range that is smaller than the first range.

21. The PV system of claim 17 further comprising a ground fault detection unit series connected to a grounded conductor of the plurality of PV strings and including a plurality of DC-DC converters, and wherein the controller is configured to:
  cause the plurality of DC-DC converters in the ground fault detection unit to increase the voltage value on the grounded conductor; and
  determine the presence and magnitude of a fault-to-ground current on the grounded conductor responsive to the increased voltage value on the grounded conductor.

* * * * *